(12) United States Patent
Mitani et al.

(10) Patent No.: US 11,406,009 B2
(45) Date of Patent: Aug. 2, 2022

(54) SUBSTRATE, POWER SUPPLY DEVICE, AND SUBSTRATE INSULATION METHOD (71) Applicants: Yukihiro Mitani, Kanagawa (JP); Keita Yoshikawa, Tokyo (JP)

(72) Inventors: Yukihiro Mitani, Kanagawa (JP); Keita Yoshikawa, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 17/103,605

(22) Filed: Nov. 24, 2020

(65) Prior Publication Data

US 2021/0076487 A1 Mar. 11, 2021

Related U.S. Application Data (63) Continuation of application No. 16/136,146, filed on Sep. 19, 2018, now Pat. No. 10,887,981.

(30) Foreign Application Priority Data

Nov. 30, 2017 (JP) .............................. JP2017-231227

(51) Int. Cl.
*H05K 1/02* (2006.01)
*H05K 7/06* (2006.01)
*H05K 9/00* (2006.01)
*G06F 1/26* (2006.01)
*H04N 1/00* (2006.01)

(52) U.S. Cl.
CPC ............. *H05K 1/0256* (2013.01); *G06F 1/26* (2013.01); *H05K 1/0215* (2013.01); *H05K 7/06* (2013.01); *H05K 9/0064* (2013.01); *H04N 1/00888* (2013.01); *H04N 1/00904* (2013.01); *H05K 1/0262* (2013.01)

(58) Field of Classification Search
CPC .. H05K 1/0262; H05K 1/0256; H05K 1/0215; H05K 7/06; H05K 9/0064; G06F 1/26
See application file for complete search history.

(56) References Cited

U.S. PATENT DOCUMENTS 4,999,762 A 3/1991 Sakamoto et al.
10,530,017 B2 * 1/2020 Kamikawa .......... H01M 10/482

FOREIGN PATENT DOCUMENTS

JP H02252286 A 10/1990
WO 2016114115 A1 7/2016

OTHER PUBLICATIONS

Japanese office action; Application 2017-231227; dated Aug. 3, 2021.

* cited by examiner

*Primary Examiner* — James Wu
(74) *Attorney, Agent, or Firm* — Duft & Bornsen, PC (57) ABSTRACT

A substrate includes a primary circuit; a secondary circuit; and a ground (GND) patterns. In a path between the primary circuit and the secondary circuit without passing through the GND pattern, reinforced insulation is provided between the primary circuit and the secondary circuit. In a path between the primary circuit and the secondary circuit through the GND pattern, one of 1) a combination of reinforced insulation and functional insulation and 2) a combination of basic insulation, additional insulation, and functional insulation is provided between the primary circuit and the secondary circuit.

9 Claims, 5 Drawing Sheets

| CONDITION ITEM | FIRST INSULATION CONDITION | SECOND INSULATION CONDITION |
|---|---|---|
| PRIMARY CIRCUIT | | |
| RATED VOLTAGE (Vac) | | |
| OPERATING VOLTAGE (Vpeak) | | ⟨ONLY DISTANCE⟩ |
| FREQUENCY (Hz) | BETWEEN PRIMARY AND GND (BASIC INSULATION: mm) | BETWEEN PRIMARY AND GND (BASIC INSULATION: mm) |
| REPEATED PEAK VOLTAGE (V) | BETWEEN PRIMARY AND SECONDARY (REINFORCED INSULATION: mm) | BETWEEN PRIMARY AND SECONDARY (REINFORCED INSULATION: mm) |
| TRANSIENT VOLTAGE (V) | | ⟨WITHSTANDING PRESSURE + DISTANCE⟩ |
| SHORT-TERM OVERVOLTAGE (V) | | BETWEEN PRIMARY AND GND (BASIC INSULATION: mm) |
| SEA LEVEL (m) | | BETWEEN PRIMARY AND SECONDARY (REINFORCED INSULATION: mm) |

FIG. 6

SUBSTRATE, POWER SUPPLY DEVICE, AND SUBSTRATE INSULATION METHOD

CROSS-REFERENCE TO RELATED APPLICATION

This patent application is based on and claims priority pursuant to 35 U.S.C. § 119(a) to Japanese Patent Application No. 2017-231227, filed on Nov. 30, 2017, in the Japan Patent Office, the entire disclosure of which is hereby incorporated by reference herein. This patent application is a continuation of co-pending U.S. patent application Ser. No. 16/136,146 (filed on Sep. 19, 2018) titled "SUBSTRATE, POWER SUPPLY DEVICE, AND SUBSTRATE INSULATION METHOD," which is hereby incorporated by reference.

BACKGROUND

Technical Field

Embodiments of the present disclosure relates to a substrate, a power supply device, and a method of insulating a substrate.

Background Art

A power supply device that supplies power to an electronic device includes a substrate on which a primary circuit and secondary circuit are disposed. In such a substrate on which both the primary circuit and the secondary circuit are provided, an area of a ground (GND) pattern is often provided with protective earth.

Further, such a substrate is formed with a conductor dimension that enables appropriate insulation (distance) and protective earth to be provided between the primary circuit and the protective earth, the secondary circuit and the protective earth, and the primary circuit and the secondary circuit, so as to prevent damage on another electronic component due to any trouble with the substrate.

SUMMARY

In one aspect of this disclosure, there is provided an improved substrate includes a primary circuit; a secondary circuit; and a ground (GND) patterns. In a path between the primary circuit and the secondary circuit without passing through the GND pattern, reinforced insulation is provided between the primary circuit and the secondary circuit. In a path between the primary circuit and the secondary circuit through the GND pattern, one of 1) a combination of reinforced insulation and functional insulation and 2) a combination of basic insulation, additional insulation, and functional insulation is provided between the primary circuit and the secondary circuit.

In another aspect of this disclosure, there is provided an improved power supply device comprising the above-described substrate.

In still another aspect of this disclosure, there is provided an improved insulation method including providing reinforced insulation between a primary circuit and a secondary circuit in a path between the primary circuit and the secondary circuit without passing through a GND pattern; and providing one of a combination of reinforced insulation and functional insulation and a combination of basic insulation, additional insulation, and functional insulation between the primary circuit and the secondary circuit, in a path between the primary circuit and the secondary circuit through the GND pattern of a substrate.

BRIEF DESCRIPTION OF THE DRAWINGS

The aforementioned and other aspects, features, and advantages of the present disclosure will be better understood by reference to the following detailed description when considered in connection with the accompanying drawings, wherein.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

In describing embodiments illustrated in the drawings, specific terminology is employed for the sake of clarity. However, the disclosure of this patent specification is not intended to be limited to the specific terminology so selected and it is to be understood that each specific element includes all technical equivalents that have the same function, operate in a similar manner, and achieve similar results.

Although the embodiments are described with technical limitations with reference to the attached drawings, such description is not intended to limit the scope of the disclosure and all of the components or elements described in the embodiments of this disclosure are not necessarily indispensable.

Embodiments of the present disclosure are described in detail with reference to the drawings. Like reference numerals designate identical or corresponding components throughout the several views and a description of same is omitted.

First Embodiment

Initially with reference to FIG. 1, a description of an application example is provided below according to the first embodiment of the present disclosure in which a substrate, a power supply device incorporating the substrate, and an insulation method are applied to an image forming apparatus.

Figure 1:
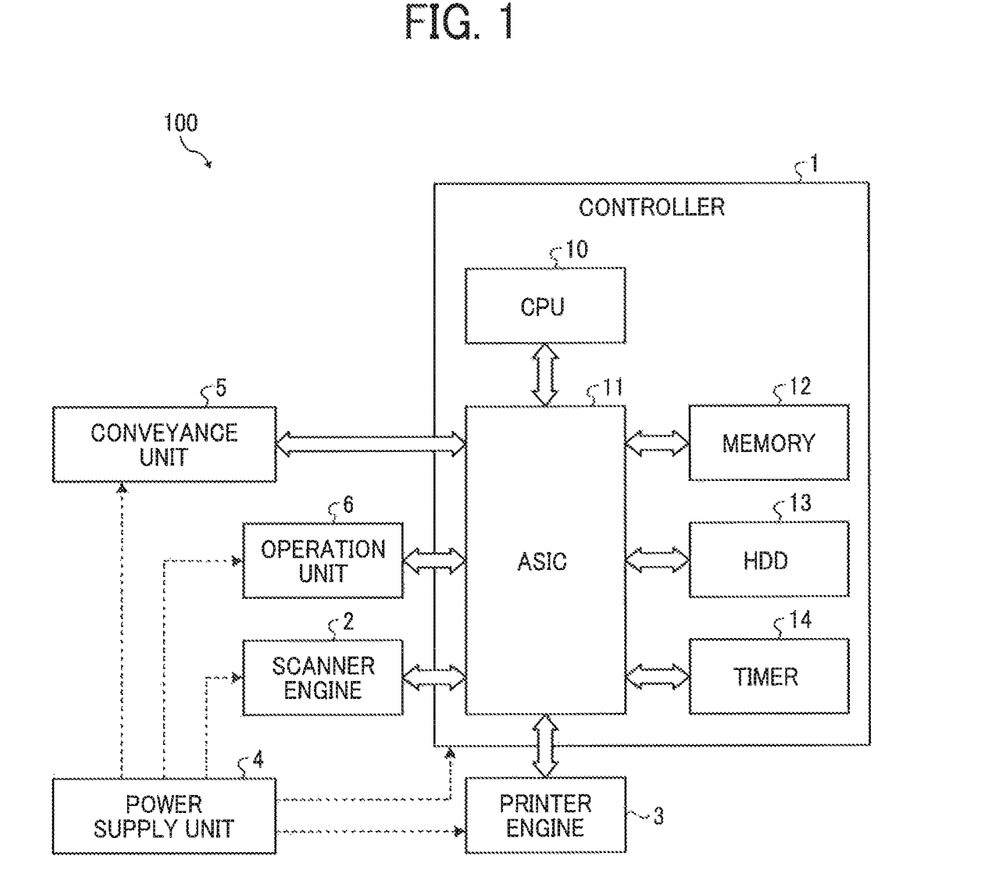
FIG. 1 is a block diagram of a hardware configuration of an image forming to a first embodiment of the present disclosure.

FIG. 1 is a block diagram of a hardware configuration of an image forming apparatus 100 to according to the first embodiment of the present disclosure. The image forming apparatus 100 in FIG. 1 is, for example, a multifunction peripheral (MFP) having multiple functions such as a printer function and a scanner function.

The image forming apparatus 100 in FIG. 1 includes a controller 1, a scanner engine 2, a printer engine 3, a power supply unit (PSU) 4 as a power supply device, a conveyance unit 5, and an operation unit 6.

The controller 1 includes a central processing unit (CPU) 10, an application specific integrated circuit (ASIC) 11, a memory 12, a hard disk drive (HDD) 13, and a timer 14. The CPU 10, the ASIC 11, the memory 12, the HDD 13, and the timer 14 are mutually connected so as to be communicable with each other via a bus line.

The operation unit 6 is a so-called touch panel in which a liquid crystal display unit (LCD) and a touch sensor are integrally formed.

An operator specifies a desired operation by touching an operation key (software key) displayed on the operation unit 6. Further, hardware keys such as a numeric keypad, a start button, a reset button, and an application switching buttons are provided adjacent to the operation unit 6.

The scanner engine 2 controls a scanner unit to optically a document. The printer engine 3 controls an image writing unit to print an image on, for example, a transfer paper. The CPU 10 comprehensively controls the image forming apparatus 100.

The ASIC 11 is a so-called large-scale integrated circuit (LSI), and performs various image processing needed for an image to be processed by the scanner engine 2 and the printer engine 3. The conveyance unit 5 conveys the transfer paper, for example, during a scanning or printing operation.

The memory 12 stores various application to be executed by the CPU 10 and various data used when the application is executed.

The HDD 13 stores, for example, image data, various programs, font data, and various files. It should be noted that a solid state disk (SSD) may be provided instead of the HDD 13 or together with the HDD 13.

The PSU 4 supplies electric power to the controller 1, the scanner engine 2, the printer engine 3, the conveyance unit 5, and the operation unit 6.

Figure 2:
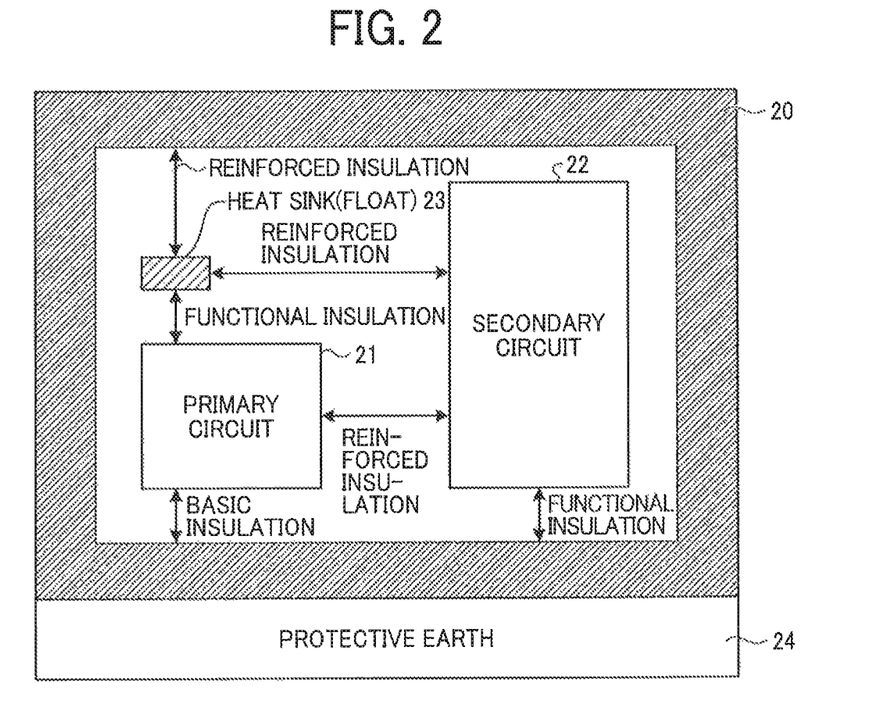
FIG. 2 is an illustration of an insulation configuration of a substrate according to a comparative example, mounted on a power supply unit.

Next, FIG. 2 is an illustration of an insulation configuration of a typical substrate according to a comparative example mounted on an electronic device of an image forming apparatus. As illustrated in FIG. 2, the substrate according to a comparative example is provided with a primary circuit 21, a secondary circuit 22, and a heat sink (float) 23.

The primary circuit 21 is directly connected to an alternating current (AC) main power supply, and includes, for example, a connection to the AC main power supply, a primary winding of a transformer, a motor, and other load devices. The secondary circuit 22 is not directly connected with the primary circuit 21, and is powered from, for example, a circuit including a secondary winding of a transformer, a converter, similar isolation device, or a battery.

The substrate according to the comparative example is provided with a ground pattern (GND pattern) 20 that surrounds the primary circuit 21, the secondary circuit 22, and the heat sink 23. Further, basic insulation is provided between the primary circuit 21 and the GND pattern 20, and functional insulation is provided between the secondary circuit 22 and the GND pattern 20.

Reinforced insulation is provided between the primary circuit 21 and the secondary circuit 22, and between the heat sink 23 and the secondary circuit 22.

In addition, reinforced insulation is provided between the heat sink 23 and the GND pattern 20, and functional isolation is provided between the heat sink 23 and the primary circuit 21.

The basic insulation is provided to protect from electric shock, on a basic level. The functional insulation is provided to protect only the normal operation of a device. The reinforced insulation is a single type of insulation that provides protection equivalent to double insulation against electric shock based on predetermined conditions. It should be noted that the double insulation is a type of insulation that provides both basic insulation and supplementary insulation. The supplemental insulation is another type of insulation, independent of the basic insulation, that is applied with the basic insulation to reduce electric shock when the basic insulation fails.

In such a substrate according to the comparative example, since the basic insulation is provided between the primary circuit 21 and the GND pattern 20, the GND pattern 20 is regarded as a protective bonding conductor.

For this reason, when a protective earth 24 is expected to have a minimum conductor dimension, the GND pattern 20 is enlarged to obtain the expected minimum conductor dimension. However, the substrate size increases by the amount of enlargement of the GND pattern 20.

It should be noted that the protective bonding conductor is a wire for connecting the main protective ground terminal of the device to the ground point or a conductor of the power cord.

Figure 3:
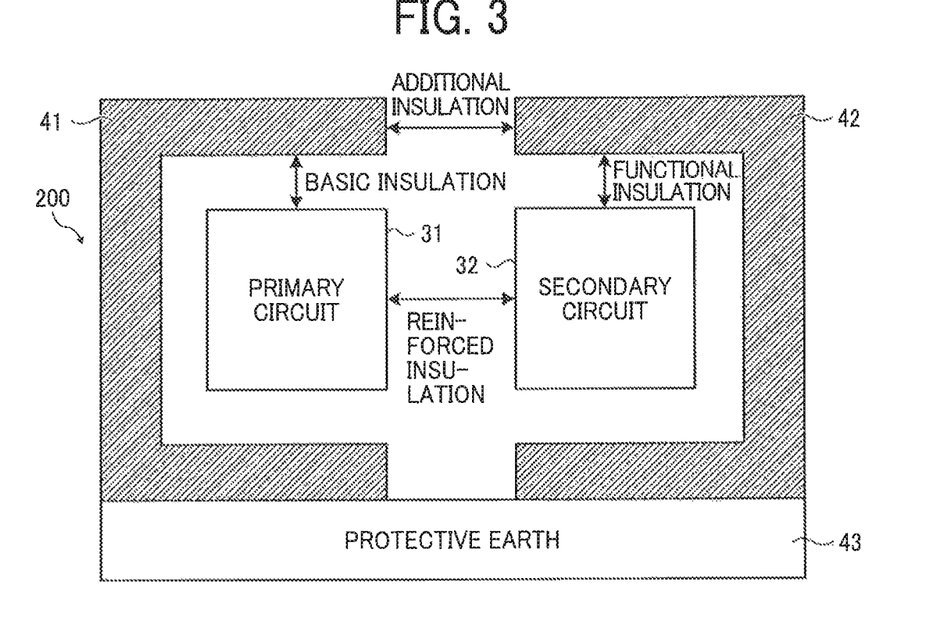
FIG. 3 is an illustration of an insulation configuration of a substrate of a power supply unit mounted on the image forming apparatus in FIG. 1.

FIG. 3 is an illustration of an insulation configuration of a substrate 200 mounted on the power supply unit 4 of the image forming apparatus according to the first embodiment of the present disclosure.

As illustrated in FIG. 3, the substrate 200 of the power supply unit 4 mounted on the image forming apparatus according to the first embodiment includes both a primary circuit 31 and a secondary circuit 32 arranged thereon. The substrate 200 has an insulation configuration in which the primary circuit 31 and the secondary circuit 32 have individual GND patterns 41 and 42, respectively. That is, the primary circuit 31 and the secondary circuit 32 does not share the same GND pattern.

In other words, the substrate 200 in FIG. 3 has an insulation configuration in which a first GND pattern 41 of the primary circuit 31 and a second GND pattern 42 of the secondary circuit 32 are separated from each other by additional insulation. With such a configuration, the GND pattern can be excluded from the protective bonding conductor.

It should be noted that the additional insulation is an independent of the basic insulation, to be applied in addition to the basic insulation, so as to, for example, protect the circuit when basic insulation fails.

More specifically, the substrate 200 in FIG. 3, in the path not passing through the first GND pattern 41 of the primary circuit 31 and the second GND pattern 42 of the secondary circuit 32, reinforced insulation is provided between the primary circuit 31 and the secondary circuit 32.

Further, in the path passing through the first GND pattern 41 of the primary circuit 31 and the second GND pattern 42 of the secondary circuit 32, the basic insulation is provided between the primary circuit 31 and the first GND pattern 41.

Further, functional insulation is provided between the secondary circuit 32 and the second GND pattern 42.

Further, as described above, the additional insulation is provided between the first GND pattern 41 and the second GND pattern 42.

That is, in the path passing through the first GND pattern 41 and (or) the second GND pattern 42, the insulation configuration provided between the primary circuit 31 and the secondary circuit 32 includes the basic insulation between the primary circuit 31 and the first GND pattern 41, the additional insulation between the first GND pattern 41 and the second GND pattern 42, and the functional insulation between the second GND pattern 42 and the secondary circuit 32. That is, the insulation configuration provided between the primary circuit 31 and the secondary circuit 32 is double insulation.

With such an insulation configuration of the substrate 200 of the power supply unit 4, reinforced insulation or double insulation is provided between the primary circuit 31 and the secondary circuit 32 so that the GND pattern can be excluded from the protection bonding conductor.

Thus, there is no need to enlarge the area of the GND pattern to satisfy the minimum conductor dimension expected for the protective earth 43. Thus, an increase in the size of the substrate 200 can be prevented.

Second Embodiment

Next, a description is given below of an image forming apparatus 100 to the second embodiment of the present disclosure. The second embodiment differs from the first embodiment only in the insulation configuration of the substrate 200 of the power supply unit 4.

Accordingly, only the insulation configuration of the substrate 200 of the power supply unit 4 will be described below, and redundant description will be omitted.

Figure 4:
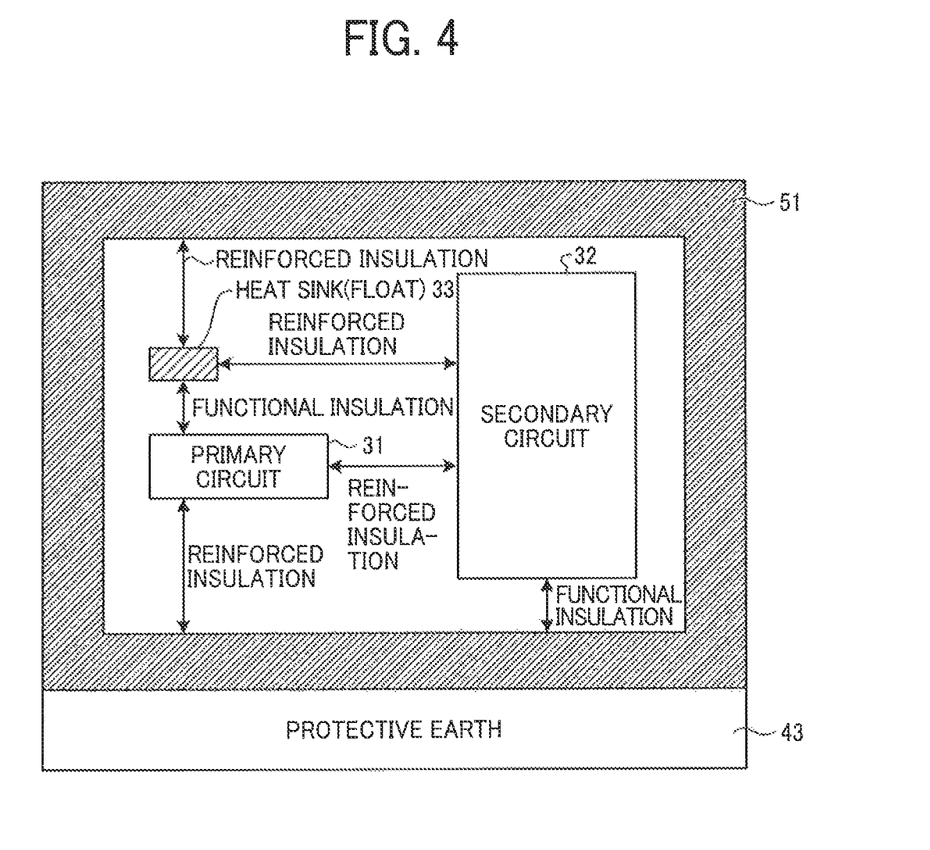
FIG. 4 is an illustration of an insulation configuration of a substrate of a power supply unit of an image forming apparatus according to a second embodiment of the present disclosure.

FIG. 4 is an illustration of an insulation configuration of the substrate 200 of the power supply unit 4 mounted on the image forming apparatus 100 according to the second embodiment of the present disclosure.

The substrate 200 according to the present embodiment includes the primary circuit 31, the secondary circuit 32 and the heat sink (float) 33 arranged thereon, and has an insulation configuration in which the primary circuit 31, the secondary circuit 32 and the heat sink (float) 33 has a common GND pattern 51.

In the insulation configuration of the substrate 200 according to the present embodiment, reinforced insulation is provided between the primary circuit 31 and the GND pattern 51. With such a configuration, the GND pattern 51 can be excluded from the protective bonding conductor.

That is, in the path between the primary circuit 31 and the secondary circuit 32 without passing through the GND pattern 51 in the substrate 200 in FIG. 4, reinforced insulation is provided between the primary circuit 31 and the secondary circuit 32.

Further, in the path between the primary circuit 31 and the secondary circuit 32 through the GND pattern 51 in the substrate 200 in FIG. 4, reinforced insulation is provided between the primary circuit 31 and the GND pattern 51 and functional insulation is provided between the secondary circuits 32 and the GND pattern 51, thus providing reinforced insulation.

With such an insulation configuration of the substrate 200 of the power supply unit 4, reinforced insulation can be provided between the primary circuit 31 and the secondary circuit 32, regardless of whether the GND pattern 51 is passed through or not between the primary circuit 31 and the secondary circuit 32. As a result, the GND pattern can be excluded from the protective bonding conductor.

Thus, similarly to the first embodiment, there is no need to enlarge the area of the GND pattern 51 to satisfy the minimum conductor dimension expected for the protective earth 43.

Thus, an increase in the size of the substrate 200 can be prevented.

Third Embodiment

Next, a description is given below of an image forming apparatus 100 to the third embodiment of the present disclosure. The third embodiment differs from the fourth embodiment only in the insulation configuration of the substrate 200 of the power supply unit 4.

Accordingly, only the insulation configuration of the substrate 200 of the power supply unit 4 will be described below, and redundant description will be omitted.

Figure 5:
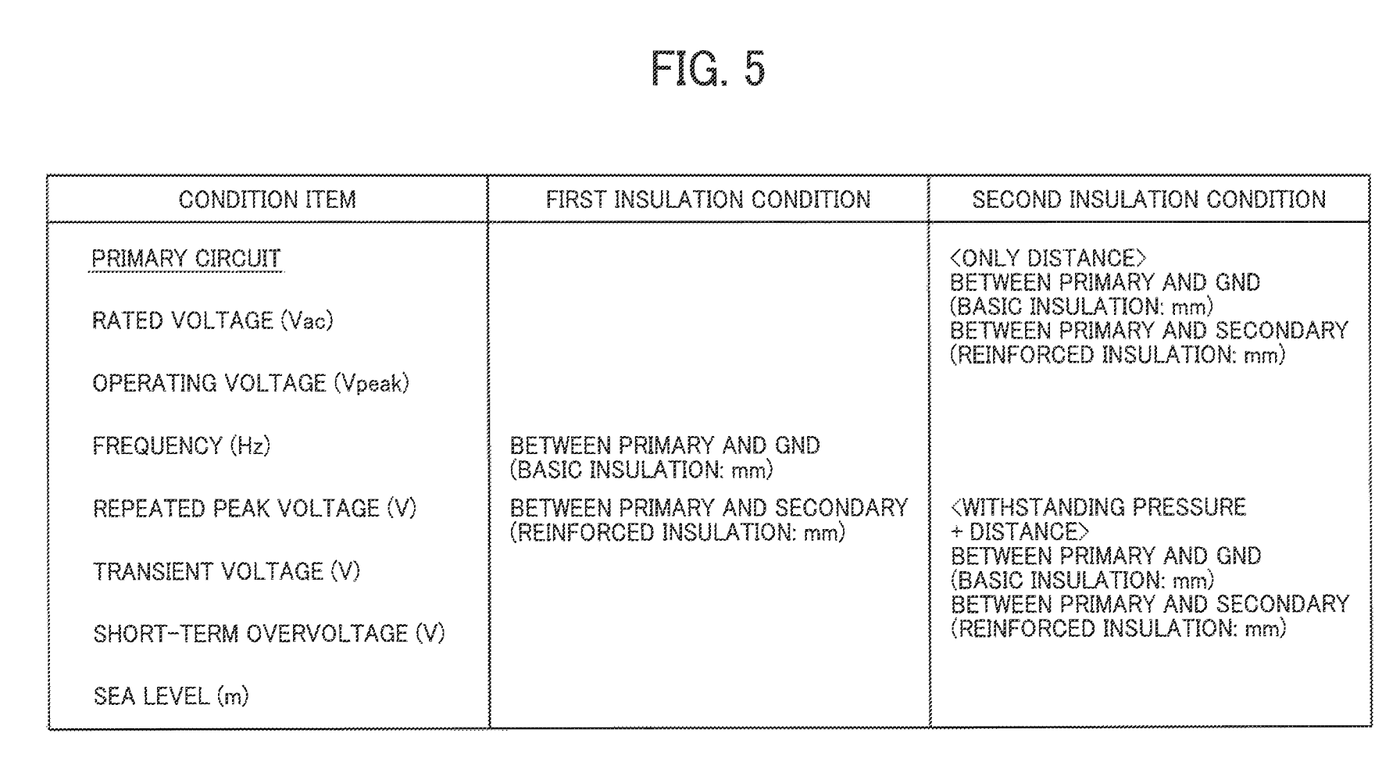
FIG. 5 is an illustration of insulation conditions of a substrate of a power supply unit of an image forming apparatus according to a third embodiment of the present disclosure.

FIG. 5 is an illustration of an insulation configuration of the substrate 200 of the power supply unit 4 mounted on the image forming apparatus 100 according to the third embodiment of the present disclosure.

In the third embodiment, the primary circuit 31 disposed on the substrate 200 has rated voltage (Vac), operating voltage (V peak), frequency (Hz), repeated peak voltage (V), transient voltage (V), short-term overvoltage (V), and operable sea level (m) as illustrated in FIG. 5. In the example of FIG. 5, a plurality of insulation distances, for example, two insulation distances, are provided in the substrate 200.

Specifically, the first insulation conditions in FIG. 5 relate to an insulation distance when any minimum conductor dimension is not expected for the GND pattern provided with protective earth. For example, the first insulation conditions are that basic insulation with an insulation distance of X millimeter (mm) is provided between the primary circuit 31 and the GND pattern 51, and reinforced insulation with an insulation distance of Y mm is provided between the primary circuit 31 and the secondary circuit 32.

In addition, "X mm" and "Y mm" are indicated by predetermined numerical values. The same applies to the following.

The second insulation conditions as illustrated in FIG. 5 relate to insulation distance when the minimum conductor dimension is expected for the GND pattern provided with the protective earth.

The second insulation conditions include the insulation distance (only distance) when no dielectric strength test is performed and insulation distance (withstand voltage and distance) when a dielectric strength test is performed.

That is, the insulation distance when the dielectric strength test needed for the insulation conditions is passed, is shorter than when the dielectric strength test is not performed, although it varies depending on various conditions such as voltage or frequency.

For example, when an insulation distance of 1.7 mm is required between the primary circuit 31 and the GND pattern 51, the dielectric strength test is passed and the insulation distance might be, for example, 1.4 mm.

The insulation condition "only distance" in the second insulation conditions of FIG. 5 indicates the insulation distance when such a dielectric strength test is not performed, and the insulation condition "withstand voltage and distance" indicates the insulation distance when the dielectric strength test is performed.

When "only the insulation distance" is specified, the second insulation conditions are that, for example, basic insulation with an insulation distance of Z mm is provided between the primary circuit 31 and the GND pattern 51, and reinforced insulation with an insulation distance of W mm is provided between the primary circuit 31 and the secondary circuit 32.

Further, when the dielectric strength test is performed and the insulation distance is specified, the second insulation conditions are that, for example, the withstand voltage of the primary circuit 31 is A (V), the withstand voltage of the secondary circuit 32 is B (V), basic insulation with an insulation distance of M mm is provided between the primary circuit 31 and the GND pattern 51, and reinforced insulation with an insulation distance of N mm is provided between the primary circuit 31 and the secondary circuit 32.

Thus, when there is a plurality of conditions for the substrate 200, the substrate 200 has an insulation configuration according to the first insulation conditions such that reinforced insulation with a long insulation distance is provided between the primary circuit 31 and the secondary circuit 32. Further, the substrate 200 has an insulation configuration according to the second insulation conditions such that insulation with a short insulation distance is provided between the primary circuit 31 and the secondary circuit 32.

Thus, when the substrate 200 in FIG. 4 has an insulation configuration according to the second insulation conditions, the GND pattern 51 can be excluded from the protective bonding conductor.

Further, when the substrate in FIG. 4 has an insulation configuration according to the first insulation conditions, the GND pattern 51 becomes the protective bonding conductor. However, the minimum conductor dimension is not expected for the GND pattern 51 under the first insulation conditions, and thus the increase in the size of the substrate 200 can be prevented.

Fourth Embodiment

Figure 6:
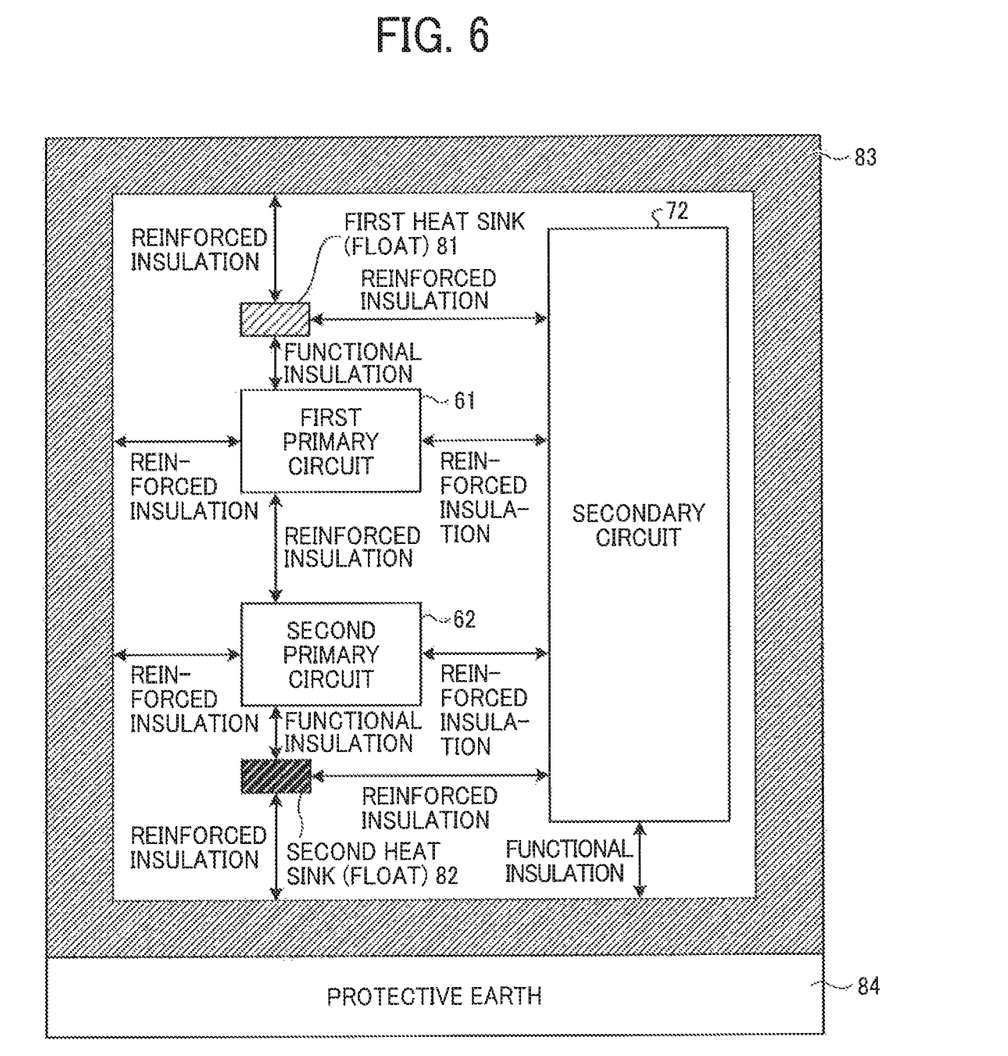
FIG. 6 is a diagram showing an insulating configuration of a substrate of a power supply device mounted on an image forming apparatus according to a fourth embodiment of the present disclosure.

Next, a description is given below of an image forming apparatus 100 to the fourth embodiment of the present disclosure. The image forming apparatus 100 according to the fourth embodiment is an example in which a plurality of primary circuits 61 and 62 is provided on the substrate 200 of the power supply unit 4.

It should be noted that the fourth embodiment differs from the above-described embodiments only in the following point. Accordingly, only the difference will be described below, and redundant description will be omitted.

FIG. 6 is a block diagram of a substrate 200 of a power supply unit 4 mounted in an image forming apparatus 100 according to the fourth embodiment of the present disclosure. The substrate 200 in FIG. 6 includes two primary circuits: a first primary circuit 61 and a second primary circuit 62.

Alternatively, the substrate 200 in FIG. 6 may include three or more primary circuits. In addition, the substrate 200 in FIG. 6 includes a first heat sink (float) 81 and a second heat sink (float) 82. Each of the heat sinks 81 and 82 is not connected to a GND pattern 83, that is, so-called floating plate metals.

Reinforced insulation is provided between the first primary circuit 61 and the second primary circuit 62.

Further, in the path between the primary circuits 61 and 62 and the secondary circuit 72 without passing through the GND pattern 83 and floating plate metals (the heat sinks 81 and 82), reinforced insulation is provided between the first primary circuit 61 and the secondary circuit 72 and between the second primary circuit 62 and the secondary circuit 72.

Further, in the path between the primary circuits 61 and 62 and the secondary circuit 72 through the GND pattern 83 and without passing through the floating plate metals (the heat sinks 81 and 82), reinforced insulation is provided the first primary circuit 61 and the secondary circuit 72 and between the second primary circuit 62 and the secondary circuit 72. Functional insulation is provided between the GND pattern 83 and the secondary circuit 72.

That is, in such a path the primary circuits 61 and 62 and the secondary circuit 72 through the GND pattern 83 and without passing through the floating plate metals, the insulation configuration includes reinforced insulation and functional insulation, thus forming reinforced insulation.

Further, in the path between the primary circuits 61 and 62 and the secondary circuit 72 through the floating plate metals (the heat sinks 81 and 82) and without passing through GND pattern 83, functional insulation is provided between the first primary circuit 61 and the first heat sink 81 and between the second primary circuit 62 and the second heat sink 82. Further, reinforced insulation is provided between the first heat sink 81 and the secondary circuit 72 and between the second heat sink 82 and the secondary circuit 72.

That is, in the path between the first primary circuit 61 and the second circuit 72 and between the second primary circuit 62 and the second circuit 72 without passing through the GND pattern 83 and the floating plate metals (the heat sinks 81 and 82), the insulation configuration includes functional insulation and reinforced insulation, thus forming reinforced insulation.

Further, in the path between the primary circuits 61 and 62 and the secondary circuit 72 through the GND pattern 83 and the floating plate metals (the heat sinks 81 and 82), functional insulation is provided between the first primary circuit 61 and the first heat sink 81 and between the second primary circuit 62 and the second heat sink 82. Further, reinforced insulation is provided between the first heat sink 81 and the GND pattern 83 and the second heat sink 82 and the GND pattern 83. Further, functional insulation is provided between the GND pattern 83 and the secondary circuit 72.

That is, in the path between the first primary circuit 61 and the second circuit 72 and between the second primary circuit 62 and the second circuit 72 through the GND pattern 83 and without passing through the floating plate metals (the heat sinks 81 and 82), the insulation configuration includes functional insulation and reinforced insulation, thus forming reinforced insulation.

With such an insulation configuration, reinforced insulation can be provided between the first primary circuit 61 and the second circuit 72 and between the second primary circuit 62 and the second circuit 72 regardless of which path is passed through. Thus, the GND pattern can be excluded from the protective bonding conductor.

Similar to the description with reference to FIGS. 3 and 4, there is no need to enlarge the area of the GND pattern 83 to satisfy the minimum conductor dimension expected for the protective earth 84. Thus, an increase in the size of the substrate 200 can be prevented.

Although the exemplary embodiments of the disclosure have been described and illustrated above, such description is not intended that the disclosure be limited to the illustrated embodiments.

Numerous additional modifications and variations are possible in light of the above teachings.

For example, in the above-described embodiments, the cases where the substrate is applied to the power supply unit 4 of a MFP are described. Alternatively, the substrate 200 may be applied to a printer device, a facsimile device, a scanner device, a copier, or the like that functions alone.

Further, instead of the MFP, the substrate according to the embodiments of the present disclosure may be applied to any electronic device such as a projector device, a video conference system, an electronic blackboard, a digital camera device, a refrigerator or a washing machine.

Although the embodiments of the present disclosure have been described above, the present disclosure is not limited to the embodiments described above, but a variety of modifications can naturally be made within the scope of the present disclosure. Numerous additional modifications and variations are possible in light of the above teachings. It is therefore to be understood that within the scope of the appended claims, the embodiments may be practiced otherwise than as specifically described herein. For example, elements and/or features of different illustrative embodiments may be combined with each other and/or substituted for each other within the scope of this disclosure and appended claims.

What is claimed is:

1. A substrate comprising:
   a primary circuit;
   a secondary circuit;
   a ground (GND) pattern configured to ground the primary circuit and the secondary circuit,
   wherein, in a path between the primary circuit and the secondary circuit without passing through the GND pattern:
      a first reinforced insulation is provided between the primary circuit and the secondary circuit,
   wherein, in a path between the primary circuit and the secondary circuit through the GND pattern:
      a second reinforced insulation is provided between the primary circuit and the GND pattern, and
      a first functional insulation is provided between the secondary circuit and the GND pattern, wherein a functional insulation is limited to protecting operation of components of the substrate,
   wherein a reinforced insulation is a single type of insulation configured to provide increased insulation against electric shock as compared to a basic insulation that is limited to protecting against electric shock.

2. The substrate according to claim 1,
   wherein the GND pattern is surrounding the primary circuit and the secondary circuit.

3. The substrate according to claim 1,
   wherein a distance of the first reinforced insulation that is between the primary circuit and the secondary circuit is longer than a distance of the functional insulation that is between the secondary circuit and the GND pattern.

4. The substrate according to claim 1,
   wherein a distance of the second reinforced insulation that is between the primary circuit and the GND pattern is longer than a distance of the first functional insulation that is between the secondary circuit and the GND pattern.

5. The substrate according to claim 1, further comprising:
   a heat sink between the primary circuit and the GND pattern.

6. The substrate according to claim 5, further comprising:
   a third reinforced insulation provided between the heat sink and the secondary circuit.

7. The substrate according to claim 5, further comprising:
   a fourth reinforced insulation provided between the heat sink and the GND pattern.

8. The substrate according to claim 6, further comprising:
   a second functional insulation provided between the primary circuit and the heat sink.

9. A power supply device comprising the substrate according to claim 8.

* * * * *